(12) United States Patent
Makiyama et al.

(10) Patent No.: US 6,620,716 B2
(45) Date of Patent: Sep. 16, 2003

(54) METHOD FOR MAKING SEMICONDUCTOR DEVICE

(75) Inventors: Kozo Makiyama, Machida (JP); Katsumi Ogiri, Yamanashi (JP)

(73) Assignees: Fujitsu Limited, Kawasaki (JP); Fujitsu Quantum Devices Ltd., Yamanashi (JP)

( * ) Notice: Subject to any disclaimer, the term of this patent is extended or adjusted under 35 U.S.C. 154(b) by 0 days.

(21) Appl. No.: 10/114,453

(22) Filed: Apr. 3, 2002

(65) Prior Publication Data

US 2003/0109098 A1 Jun. 12, 2003

(30) Foreign Application Priority Data

Oct. 30, 2001 (JP) ........................... 2001-333458

(51) Int. Cl.[7] ..................... H01L 21/338; H01L 21/285
(52) U.S. Cl. ........................ 438/585; 438/182
(58) Field of Search ................ 438/182, 585–596, 438/944, FOR 193, FOR 198, 949, FOR 446, FOR 439; 430/296, 312, 315

(56) References Cited

U.S. PATENT DOCUMENTS

| | | | | |
|---|---|---|---|---|
| 4,644,170 A | * | 2/1987 | Komatsu | 250/492.2 |
| 5,180,653 A | * | 1/1993 | Miyabe et al. | 430/296 |
| 5,525,534 A | * | 6/1996 | Ikemasu et al. | 438/763 |
| 5,981,319 A | * | 11/1999 | Lothian et al. | 438/167 |
| 6,214,494 B1 | * | 4/2001 | Bula et al. | 430/5 |
| 6,238,850 B1 | * | 5/2001 | Bula et al. | 430/394 |
| 6,368,516 B1 | * | 4/2002 | Carpi et al. | 216/41 |
| 2001/0016300 A1 | * | 8/2001 | Iwata et al. | 430/314 |
| 2002/0042029 A1 | * | 4/2002 | Kamijima et al. | 430/329 |
| 2002/0086225 A1 | * | 7/2002 | Huang et al. | 430/5 |

* cited by examiner

*Primary Examiner*—George Fourson
*Assistant Examiner*—Suk-San Foong
(74) *Attorney, Agent, or Firm*—Armstrong, Westerman & Hattori, LLP

(57) ABSTRACT

A method for making a semiconductor device includes forming a resist pattern having a multi-layered structure by performing a plurality of development steps, the resist pattern including a first opening corresponding to a fine gate section of a gate electrode and a second opening placed on the first opening, the second opening corresponding to an over-gate section which is wider than the fine gate section and having a cross section protruding like an overhang, wherein every angle of the second opening at the tip of the over-gate section is more than 90 degrees; and forming the gate electrode provided with the fine gate section and the over-gate section by depositing electrode materials on the resist pattern.

8 Claims, 12 Drawing Sheets

METHOD FOR MAKING SEMICONDUCTOR DEVICE

BACKGROUND OF THE INVENTION

1. Field of the Invention

The present invention relates to methods for making field-effect transistors.

2. Description of the Related Art

FIG. 1 is a schematic diagram of la conventional field-effect transistor which has a HEMT structure. The field-effect transistor includes an i-type InP substrate 1, a channel layer 2 composed of i-type InGaAs, an electron supply layer 3 composed of n-type InAlAs, a barrier layer 4 composed of i-type InAlAs, a stopper layer 5 composed of i-type InP, a cap layer 6 composed of high concentration n-type InGaAs, a gate electrode 7, a source electrode 8, and a drain electrode 9.

In the field-effect transistor shown in FIG. 1, a two-dimensional electron gas (not shown in the drawing) is formed between the channel layer 2 and the electron supply layer 3. The barrier layer 4 reduces an electric field applied from the gate electrode 7, thereby improving the gate breakdown voltage. The cap layer 6, which decreases the contact resistances of the source electrode 8 and the drain electrode 9, is provided on the barrier layer 4 with the stopper layer 5 therebetween. The stopper layer 5 functions as an etching stopper in the process of removing the cap layer 6. The gate electrode 7 is provided on the exposed stopper layer 5 after the cap layer 6 is removed, and the gate electrode 7 includes a fine gate section 7A which substantially contributes to the gate operation of the transistor and an over-gate section 7B which decreases the resistance in the gate electrode 7.

Next, the formation process of the gate electrode 7 will be described.

FIGS. 2A and 2B are schematic diagrams illustrating the formation process of the gate electrode 7. FIG. 2A is a sectional view of a region corresponding to the region A indicated by the broken line in FIG. 1.

As shown in FIG. 2A, the gate electrode 7 is formed using a resist pattern composed of first to third resist layers 10 to 12. The resist pattern includes the first resist layer 10 for determining the pattern of the fine gate section, the third resist layer 12 for determining the pattern of the over-gate section, and the second resist layer 11 disposed between the first resist layer 10 and the third resist layer 12, the second resist layer 11 being side etched so that the third resist layer 12 protrudes like an overhang.

The patterns of the first resist layer 10 and the third resist layer 12 are formed, for example, using electron beam exposure, and the pattern of the second resist layer 11 is formed by etching such that over-etching occurs in the transverse direction in the etching step performed after the pattern of the third resist layer 12 is formed.

As electrode materials, for example, a Ti layer 7-1, a Pt layer 7-2, and a Au layer 7-3 are deposited over the resist pattern thus formed. Since the second resist layer 11 is side etched, the individual electrode materials are separated between the interior of the resist pattern for forming the gate electrode and an unnecessary section over the third resist layer 12.

When the resist layers are removed, the unnecessary gate electrode materials over the third resist layer 12 are also removed, and as shown in FIG. 2B, the gate electrode 7 is produced.

In field-effect transistors, in order to improve the high frequency characteristics, gate electrodes must be miniaturized, and such a demand has been increasing.

In order to form gate electrodes accurately, resist patterns for forming the gate electro des must be formed accurately.

SUMMARY OF THE INVENTION

It is an object of the present invention to provide a method for forming a gate electrode accurately.

The present inventor has carried but research and found that cracking occurs in resist patterns for forming gate electrodes.

This will be described with reference to FIG. 3.

FIG. 3 is an enlarged plan view which shows an end of a gate electrode and which shows a state corresponding to the state before the gate electrode materials are deposited in FIG. 2A. In FIG. 3, the same numerals as FIG. 2A are used for the same parts, and the second resist layer 11 under the third resist layer 12 is indicated by a broken line because the second resist layer 11 is side etched so as to retreat from the edge of the third resist layer 12.

As is obvious from FIG. 3, the third resist layer 12 located at the outside periphery of the resist pattern is cracked at a corner of the tip of the gate electrode. The cracking of the resist layer occurs in the development step of the pattern of the first resist layer 10 (fine gate section) or in the subsequent rinsing step, and in these steps, expansion and contraction are considered to occur rapidly in the first resist layer 10 (and also in the second resist layer 11 or the third resist layer 12), resulting in the cracking. Additionally, the cracking of the third resist layer 12 extends from the region protruding like an overhang under which the second resist layer 11 is side etched to the second resist layer 11 beneath, and also to the first resist layer 10.

If gate electrode materials are deposited on such a resist pattern in which the cracking has occurred, since the gate electrode materials are also embedded in the cracking, the embedded gate electrode materials may remain after the resist layers are removed, resulting in short-circuiting due to contact with another gate electrode of an adjacent field-effect transistor. Even if the embedded gate electrode materials are removed in the process of removing the resist layers, they may be redeposited on the surface of the chip, resulting in short-circuiting.

Moreover, if the resist pattern is cracked, a fatal flaw may occur in the gate electrode having the over-gate section. For example, since the planar shape of the over-gate section is deformed due to the cracking in the resist layer and a deviation occurs in the overlap of the over-gate section and the fine gate section, stress applied from the over-gate section to the fine gate section becomes nonuniform. Thereby, nonuniform stress occurs in a portion of the fine gate section in contact with the semiconductor layer, and for example, an electric field due to the piezo-effect degrades the transistor characteristics. If the stress applied to the fine gate section is excessive, the gate electrode itself may collapse.

The cracking of the resist pattern at the corner of the over-gate section occurs when a multi-layered resist structure is used in which a plurality of development steps are performed and the resist pattern includes a pattern of the fine gate section and a pattern of the over-gate section protruding like an overhang. Based on the finding described above, the present invention has been achieved to avoid cracking in the resist pattern.

In one aspect of the present invention, a method for making a semiconductor device includes forming a resist pattern having a multi-layered structure by performing a plurality of development steps, the resist pattern including a first opening corresponding to a fine gate section of a gate electrode and a second opening placed on the first opening, the second opening corresponding to an over-gate section which is wider than the fine gate section and having a cross section protruding like an overhang, in which every angle of the second opening at the tip of the over-gate section is more than 90 degrees; and forming the gate electrode provided with the fine gate section and the over-gate section by depositing electrode materials on the resist pattern. A typical example of this structure is shown in FIG. 4. As is obvious from the drawing, in a pattern 20 of the over-gate section, all the corners at the tip thereof have angles of more than 90 degrees. Consequently, stress at each corner is scattered, thus preventing the resist pattern from being cracked.

In another aspect of the present invention, a method for making a semiconductor device includes forming a resist pattern having a multi-layered structure by performing a plurality of development steps, the resist pattern including a first opening corresponding to a fine gate section of a gate electrode and a second opening placed on the first opening, the second opening corresponding to an over-gate section which is wider than the fine gate section and having a cross section protruding like an overhang, in which corners of the second opening at the tip of the over-gate section are arc-shaped; and forming the gate electrode provided with the fine gate section and the over-gate section by depositing electrode materials on the resist pattern. A typical example of this structure is shown in FIG. 5. As is obvious from the drawing, in a pattern 20 of the over-gate section, the corners at the tip thereof are arc-shaped. Consequently, the entire corners relieve the concentration of stress, thus preventing the resist pattern from being cracked.

In another aspect of the present invention, a method for making a semiconductor device includes forming a resist pattern having a multi-layered structure by performing a plurality of development steps, the resist pattern including a first opening corresponding to a fine gate section of a gate electrode and a second opening placed on the first opening, the second opening corresponding to an over-gate section which is wider than the fine gate section and having a cross section protruding like an overhang, in which corners of the second opening at the tip of the over-gate section have steps, the steps being convexed inward; and forming the gate electrode provided with the fine gate section and the over-gate section by depositing electrode materials on the resist pattern. A typical example of this structure is shown in FIG. 6. As is obvious from the drawing, in a pattern 20 of the over-gate section, the corners at the tip thereof have steps which are convexed inward. Consequently, stress at each corner is distributed to the tips of the steps, thus preventing the resist pattern from being cracked. Additionally, although each corner has three steps in the structure shown in FIG. 6, the number of steps is not limited in the present invention.

In another aspect of the present invention, a method for making a semiconductor device includes forming a resist pattern having a multi-layered structure by performing a plurality of development steps, the resist pattern including a first opening corresponding to a fine gate section of a gate electrode and a second opening placed on the first opening, the second opening corresponding to an over-gate section which is wider than the fine gate section and having a cross section protruding like an overhang, in which corners of the second opening at the tip of the over-gate section are selectively subjected to multiple exposure; and forming the gate electrode provided with the fine gate section and the over-gate section by depositing electrode materials on the resist pattern. A typical example of this structure is shown in FIG. 7. As is obvious from the drawing, in a pattern 20 of the over-gate section, the corners at the tip thereof are subjected to multiple exposure, resulting in over-exposure. Thereby, images are blurred, which leads to curving. Consequently, the curved corners prevent stress concentration, and the resist pattern can be prevented from being cracked.

In each method for making the semiconductor device described above, preferably, the formation process of the resist pattern further includes exposure steps for forming the first opening and the second opening, said exposure steps being performed by electron beam exposure.

Preferably, the resist pattern includes a first resist layer provided with the first opening, a second resist layer constituting a side wall of the second opening which protrudes like an overhang, and a third resist layer constituting a protrusion of the second opening.

In such a case, preferably, the formation process of the resist pattern further includes the steps of forming the first to third resist layers in that order, forming an opening of a pattern corresponding to the over-gate section in the third resist layer, side etching the second resist layer using the opening formed in the third resist layer as a mask, and forming an opening of a pattern corresponding to the fine gate section in the first resist layer.

Preferably, the formation process of the resist pattern further includes an exposure step for forming the opening in the first resist layer after the step of side etching the second resist layer.

Alternatively, preferably, the formation process of the resist pattern further includes an exposure step for forming the opening in the first resist layer before the step of side etching the second resist layer.

Preferably, the formation process of the resist pattern further includes an exposure step for forming an opening in the second resist layer, and both the exposure step for forming the opening in the first resist layer and the exposure step for forming the opening in the third resist layer are performed by electron beam exposure.

DESCRIPTION OF THE PREFERRED EMBODIMENTS

Figure 1:
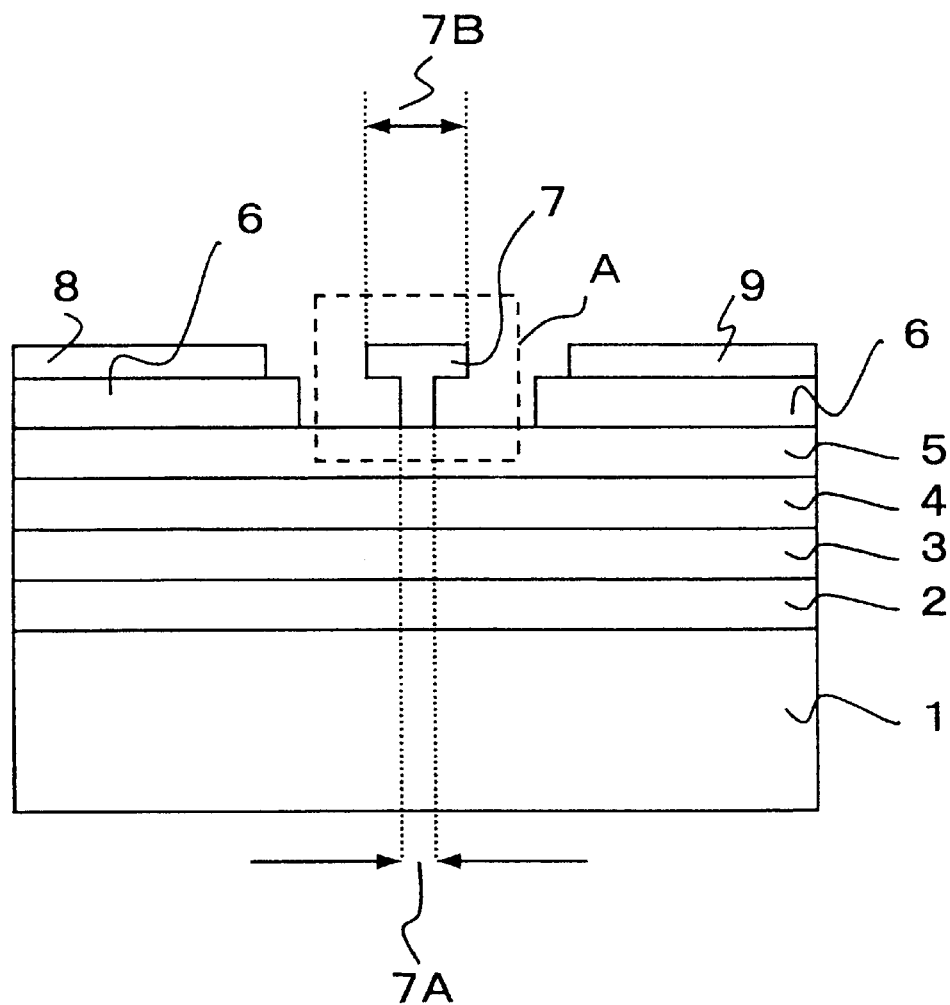
FIG. 1 is a schematic diagram of a conventional field-effect transistor.
Figure 2A:
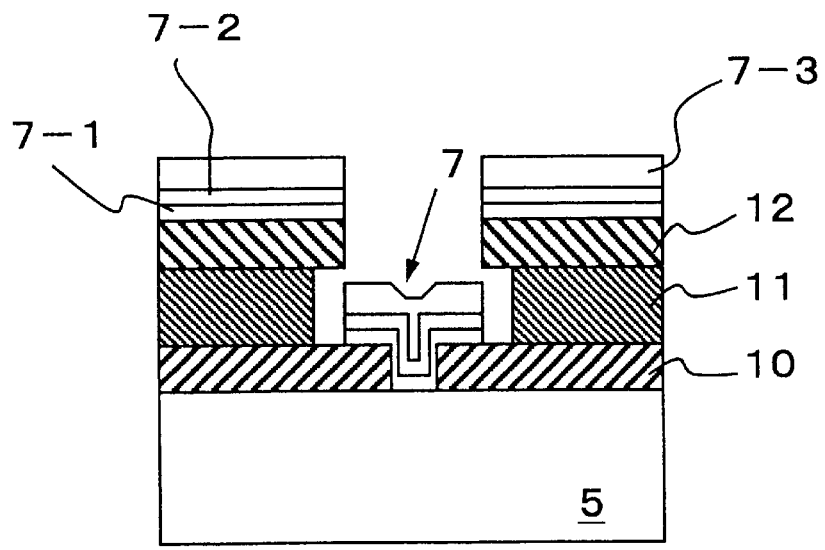
FIGS. 2A and 2B are schematic diagrams illustrating the formation process of a gate electrode of the conventional field-effect transistor.
Figure 2B:
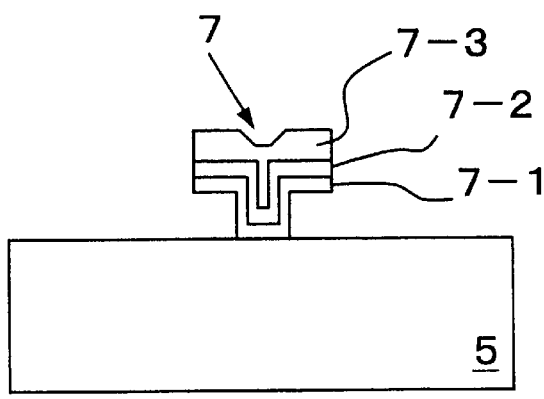
Figure 3:
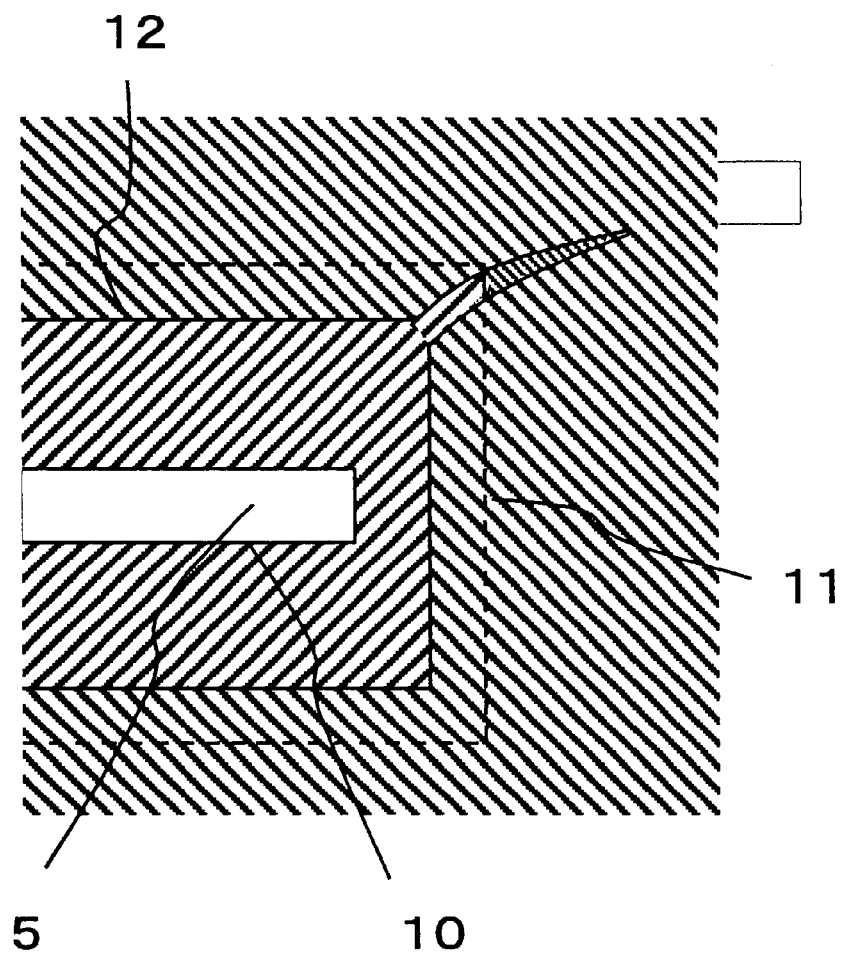
FIG. 3 is a schematic diagram illustrating a problem found by the present inventor.
Figure 4:
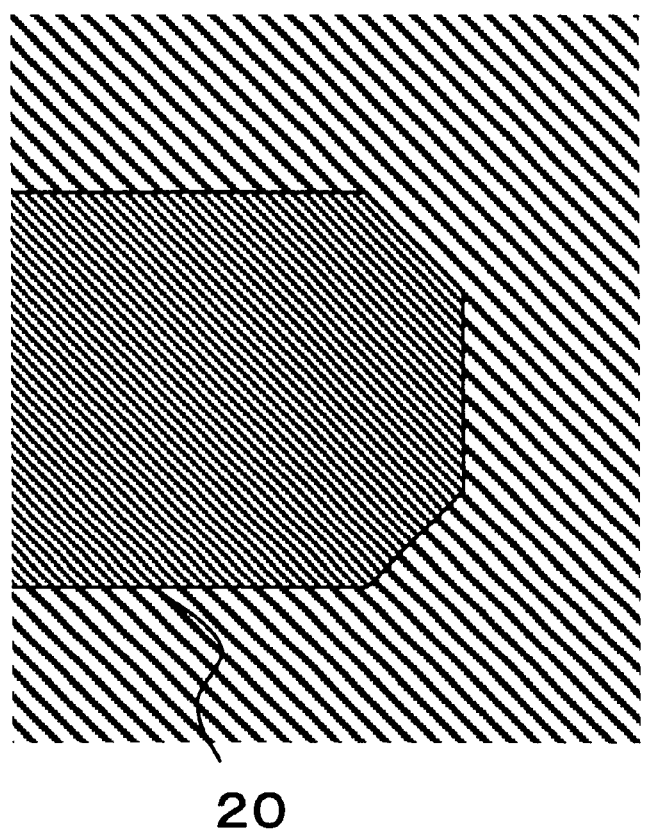
FIG. 4 is a schematic diagram showing a shape of the tip of an over-gate section in the present invention.

A first embodiment of the present invention will be described with reference to FIGS. 8A and 8B to FIG. 12, which illustrate steps of forming a gate electrode 7 of the field-effect transistor described with reference to FIG. 1. The formation of the layers other than the gate electrode 7 is not described. FIGS. 8B, 9B, 10B, 11, and 12 are enlarged sectional views of a region corresponding to the region A indicated by the broken line in the periphery of the gate shown in FIG. 1.

Figure 8A:
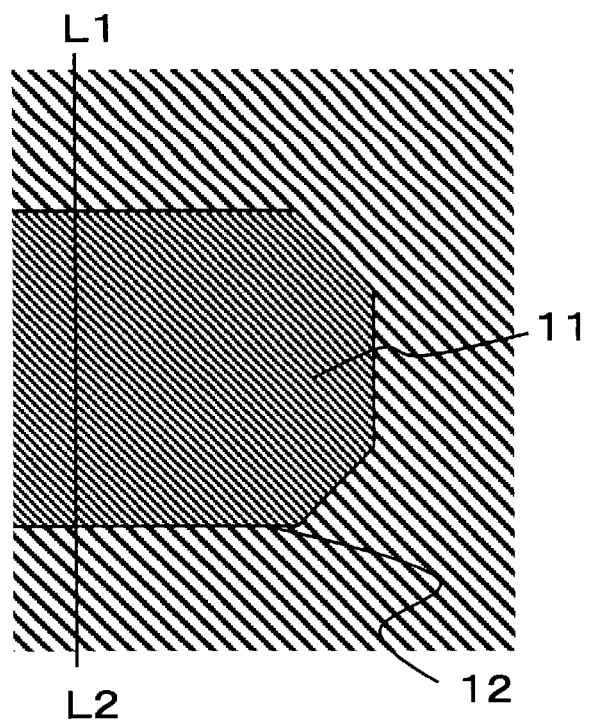
FIGS. 8A and 8B are schematic diagrams showing a pattern of a third resist layer in a first embodiment of the present invention.
Figure 8B:
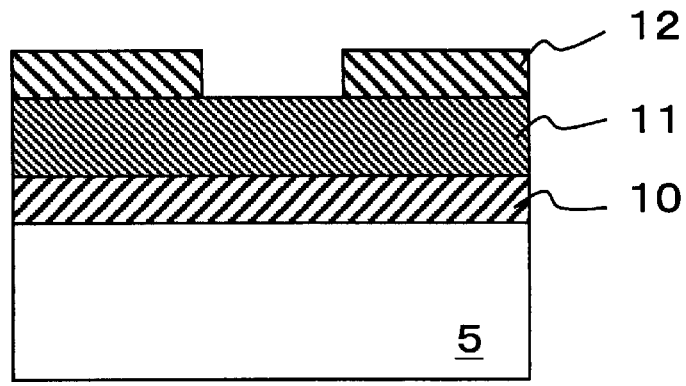

FIG. 8A is a plan view and FIG. 8B is a sectional view taken along the line L1–L2 of FIG. 8A.

First, a first resist layer 10, a second resist layer 11, and a third resist layer 12 are formed on the exposed surface of a stopper layer 5 by a known spin coating method or the like. The details of the individual layers are described below.

First resist layer 10
Material: Polymethyl methacrylate (PMMA)-based resist for electron beam exposure, for example, ZEP2000 (trade name) manufactured by Nippon Zeon Co., Ltd.
Thickness: 300 nm
Curing temperature/time: 185° C./10 min
Second resist layer 11
Material: Alkali-soluble resist, for example, PMGI (trade name) manufactured by MICRO CHEMISTRY CORPORATION
Thickness: 500 nm
Curing temperature/time: 185° C./5 min
Third resist layer 12
Material: Polystyrene-based resist for electron beam exposure, for example, ZEP520-A7 (trade name) manufactured by Nippon Zeon Co., Ltd.
Thickness: 300 nm
Curing temperature/time: 185° C./5 min Among the individual resist layers thus formed, a pattern of the over-gate section is exposed on the third resist layer 12 using electron beam exposure, and then development treatment which includes rinsing treatment, etc., is performed. The pattern of the over-gate section is thereby formed. At the tip of the over-gate section, as shown in FIG. 8A, four corners are formed, each with an angle of approximately 135 degrees.

Figure 9A:
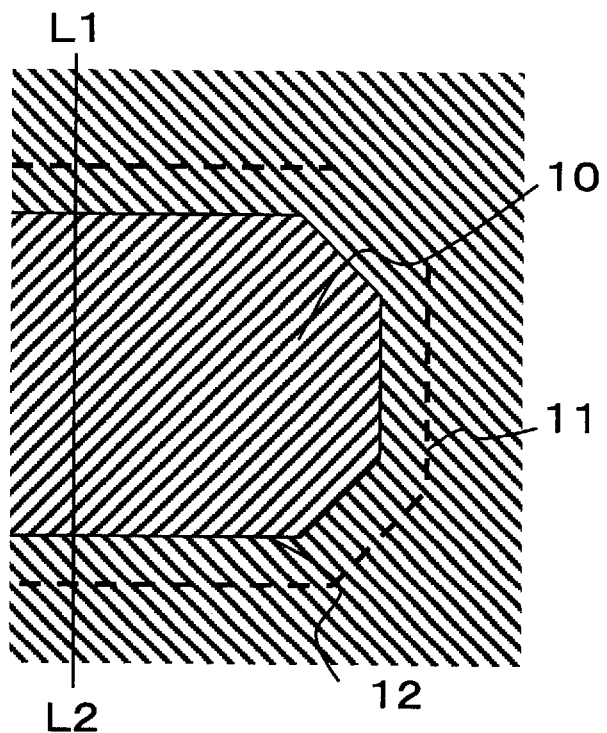
FIGS. 9A and 9B are schematic diagrams showing a pattern of a second resist layer in the first embodiment of the present invention.
Figure 9B:
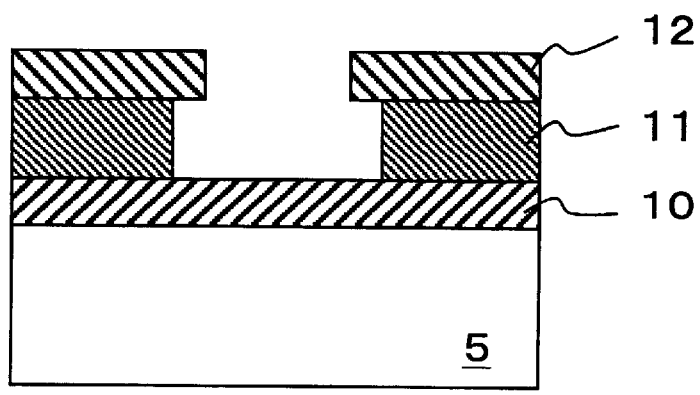

FIG. 9A is a plan view and FIG. 9B is a sectional view taken along the line L1–L2 of FIG. 9A.

The second resist layer 11 exposed by the step shown in FIGS. 8A and 8B is etched using the pattern of the over-gate section in the third resist layer 12. Etching selectivity is exhibited between the first resist layer 10 and the third resist layer 12, and the etching is performed until side etching occurs in the transverse direction.

The etching is performed under the conditions described below.

Figure 10A:
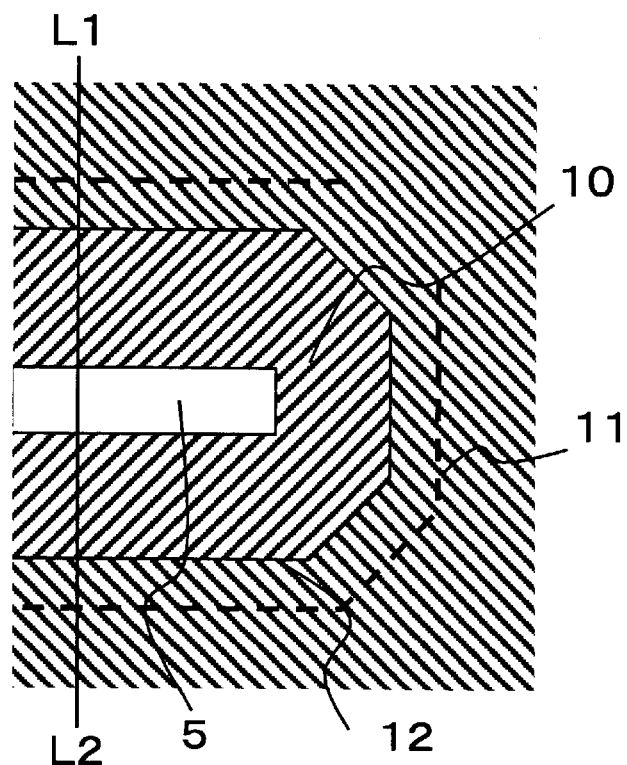
FIGS. 10A and 10B are schematic diagrams showing a pattern of a first resist layer in the first embodiment of the present invention.
Figure 10B:
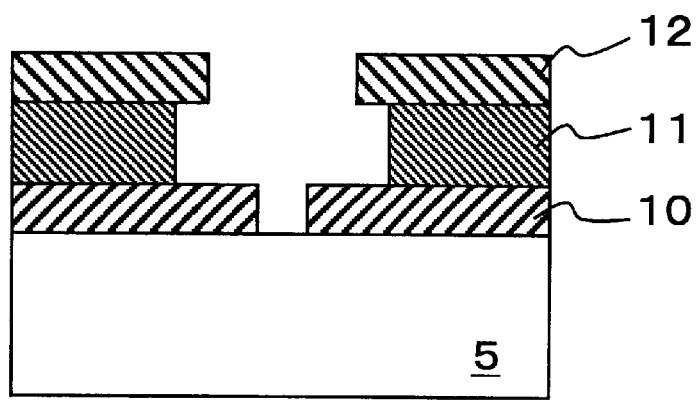

Etchant: Aqueous tetramethylammonium hydroxide (TMAH) solution
Etching time: 30 sec FIG. 10A is a plan view and FIG. 10B is a sectional view taken along the line L1–L2 of FIG. 10A.

Using electron beam exposure, a pattern of the fine gate section is exposed on the first resist layer 10 exposed by the step shown in FIGS. 9A and 9B, and then development treatment which includes rinsing treatment, etc., is performed. The pattern of the fine gate section is thereby formed.

As described above, in order to form a resist pattern with a fine gate pattern and an over-gate pattern protruding like an overhang, a plurality of development steps must be performed. In this embodiment, even if such steps are performed, the corners of the third resist layer 12 at the tip of the over-gate section do not become cracked.

In this embodiment, the pattern of the fine gate section is exposed and developed after the pattern of the over-gate section is exposed and developed. However, the exposure of the pattern of the over-gate section and the exposure of the pattern of the fine gate section may be performed without a development step, and then development steps may be performed on the individual resist layers. Even in such a case, the problem of cracking of the resist pattern due to a plurality of development steps is overcome by the present invention.

Figure 11:
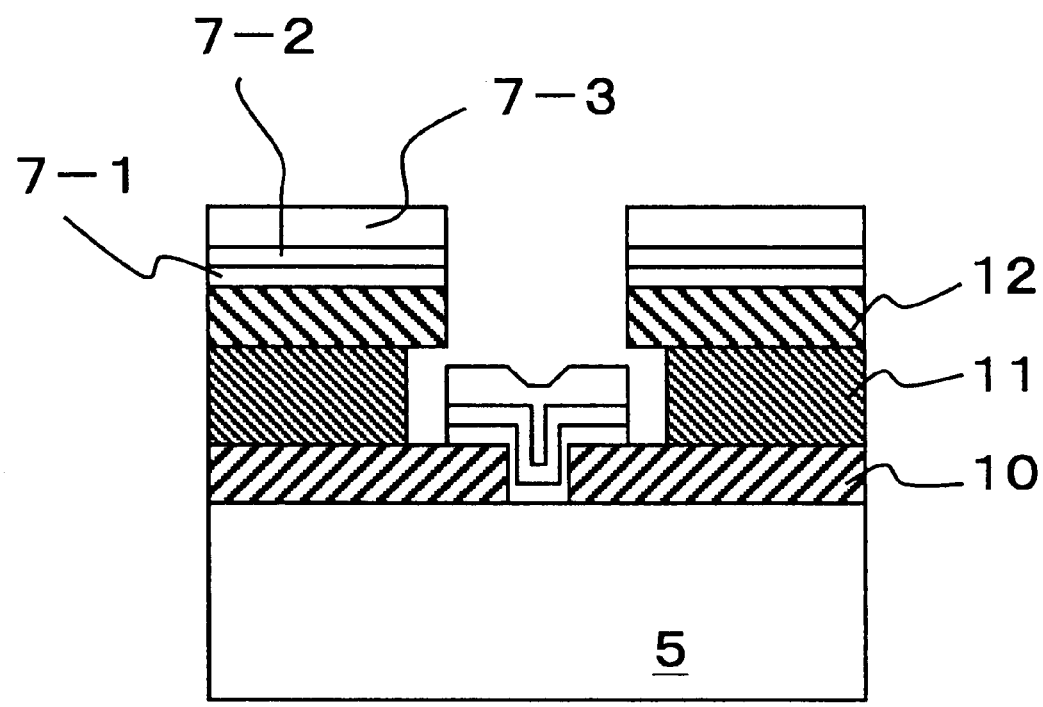
FIG. 11 is a schematic diagram illustrating a step of depositing electrode materials in the first embodiment of the present invention.

Next, as shown in FIG. 11, gate electrode materials are deposited on the resist pattern thus formed.

Figure 12:
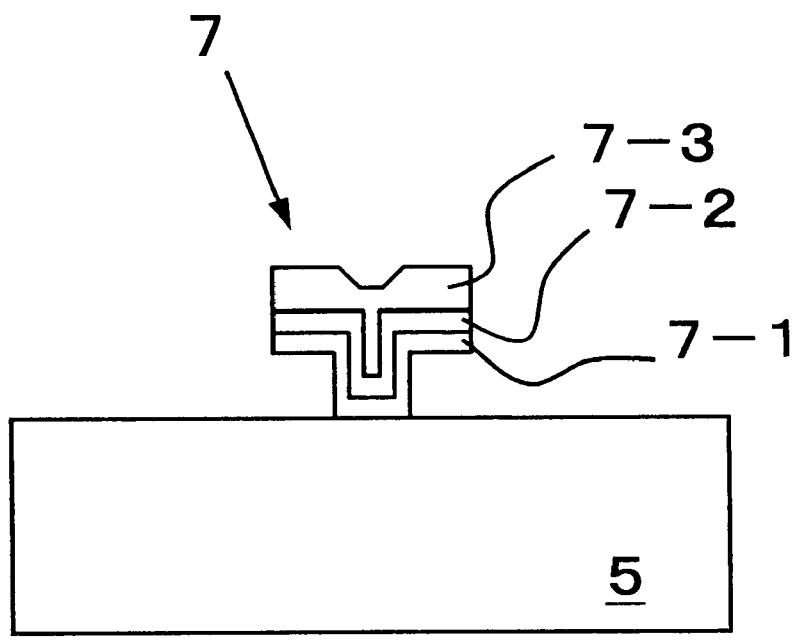
FIG. 12 is a schematic diagram showing a shape of a gate electrode in the first embodiment of the present invention.

In this embodiment, the gate electrode has a three-layered structure of Ti layer/Pt layer/Au layer.
The details of the individual layers are described below.
Ti layer 7-1
Thickness: 10 nm
Deposition method: Vapor deposition
Pt layer 7-2
Thickness: 50 nm
Deposition method: Vapor deposition
Au layer 7-3
Thickness: 400 nm
Deposition method: Vapor deposition As shown in FIG. 12, the electrode materials deposited on the third resist layer are removed together with the first to third resist layers. The gate electrode 7 is thereby produced.

The first to third resist layers are removed under the conditions described below.

Etchant: Mixed solution of aromatic compound and amine compound
Separation time: 10 min In accordance with the steps described above, the third resist layer corresponding to the over-gate section does not become cracked. Therefore, electrode materials are not embedded in a cracked portion and short-circuiting between electrodes is prevented. Since the position of the overgate section does not deviate in relation to the fine gate section of the gate electrode, it is possible to prevent a degradation in transistor characteristics and a collapse of the gate electrode.

A second embodiment of the present invention will now be described.

Figure 5:
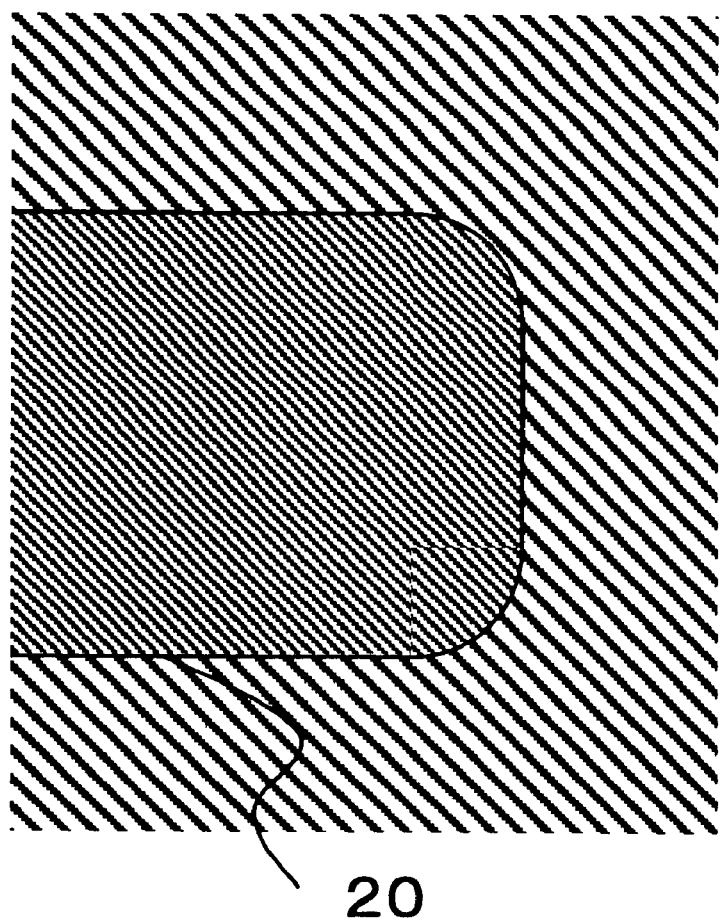
FIG. 5 is a schematic diagram showing a shape of the tip of an over-gate section in a second embodiment of the present invention.

In this embodiment, the tip of the over-gate section shown in FIG. 8A is formed so that the corners thereof are arc-shaped as described with reference to FIG. 5.

In order to form the arc-shaped pattern, various known methods may be used. For example, when an electron beam exposure method is employed, in the part to be arc-shaped, the scanning pattern is changed so that the periphery of the pattern traces an arc. Apart from this, the same step may be performed as that in the first embodiment.

In the second embodiment, the resist pattern at the over-gate section is also prevented from being cracked.

Figure 6:
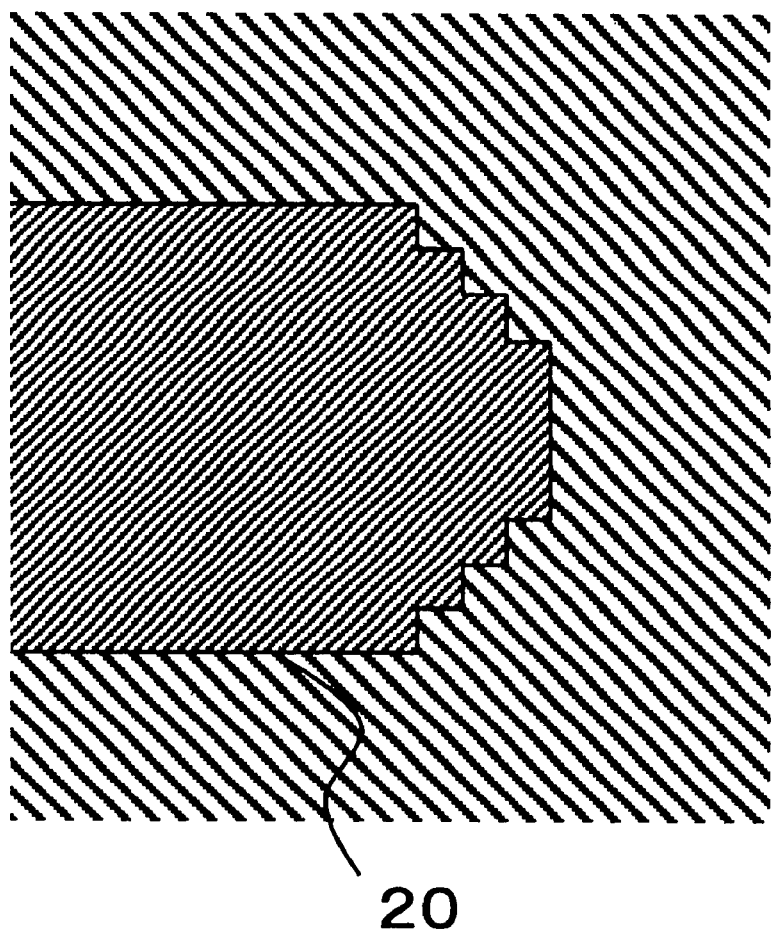
FIG. 6 is a schematic diagram showing a shape of the tip of an over-gate section in a third embodiment of the present invention.

In a third embodiment of the present invention, the tip of the over-gate section shown in FIG. 8A is formed so that the corners thereof have steps as described with reference to FIG. 6.

In order to form the stepped pattern, various known methods may be used. For example, when an electron beam exposure method is employed, in the part to be stepped, the scanning pattern is changed so that the periphery of the pattern forms steps. Additionally, when a block exposure method by electron beams through a stencil mask is employed, the exposure program is prepared so that block patterns are formed like steps. Apart from this, the same step may be performed as that in the first embodiment.

In the third embodiment, the resist pattern at the over-gate section is also prevented from being cracked.

In a fourth embodiment of the present invention, the tip of the over-gate section shown in FIG. 8A is formed so that the corners thereof are curved by multiple exposure.

Various known methods for multiple exposure may be used. For example, when an electron beam exposure method is employed, a pattern in which the tip of the over-gate section is rectangular (i.e., the corners are substantially 90 degrees) is depicted, and then the corners to be curved are irradiated with a beam of electrons again so that over-exposure is brought about.

Figure 7:
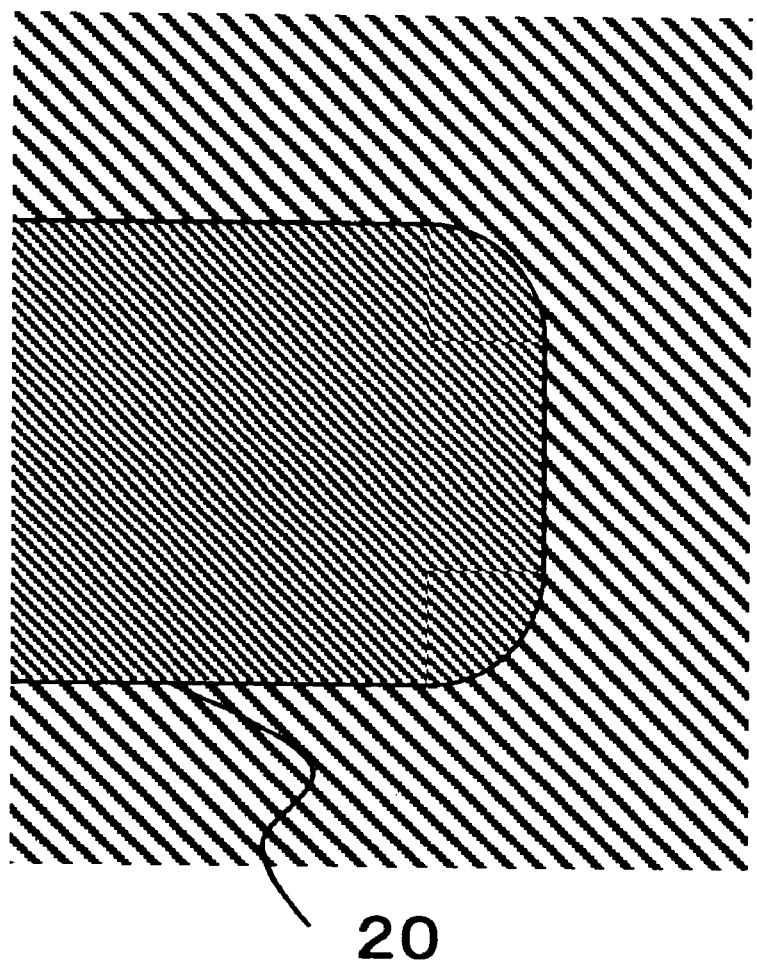
FIG. 7 is a schematic diagram showing a shape of the tip of an over-gate section in a fourth embodiment of the present invention.

In the over-exposed parts, exposed images are blurred, and the developed pattern has curved corners as shown in FIG. 7. Apart from this, the same step may be performed as that in the first embodiment.

In the fourth embodiment, the resist pattern at the over-gate section is also prevented from being cracked.

In the individual embodiments described above, the field-effect transistor with a HEMT structure using InP-based materials has been described. However, the present invention is not limited thereto.

For example, the present invention is also applicable to field-effect transistors composed of GaAs, GaN, or Si as semiconductor materials other than InP, and to field-effect transistors without a HEMT structure.

As described above, in accordance with the present invention, since the resist pattern is not cracked at the corners of the tip of the over-gate section, the production yield is improved and stable transistor characteristics can be obtained.

What is claimed is:

1. A method for making a semiconductor device comprising:

forming a resist pattern having a multi-layered structure by performing a plurality of development steps, the resist pattern comprising a first opening corresponding to a fine gate section of a gate electrode and a second opening placed on the first opening, the second opening corresponding to an over-gate section which is wider than the fine gate section and having a cross section protruding over an undercut in an underlying layer, wherein every angle of the second opening at the tip of the over-gate section is more than 90 degree; and forming the gate electrode provided with the fine gate section and the over-gate section by depositing electrode materials on the resist pattern.

2. A method for making a semiconductor device comprising:

forming a resist pattern having a multi-layered structure by performing a plurality of development steps, the resist pattern comprising a first opening corresponding to a fine gate section of a gate electrode and a second opening placed on the first opening, the second opening corresponding to an over-gate section which is wider than the fine gate section and having a cross section protruding over an undercut in an underlying layer, wherein corners of the second opening at the tip of the over-gate section have steps, the steps being convexed inward; and forming the gate electrode provided with the fine gate section and the over-gate section by depositing electrode materials on the resist pattern.

3. A method for making a semiconductor device according to any one of claims 1 to 2, wherein the formation process of the resist pattern further comprises exposure steps for forming the first opening and the second opening, said exposure steps being performed by electron beam exposure.

4. A method for making a semiconductor device according to any one of claims 1 to 2, wherein the resist pattern comprises a first resist layer provided with the first opening, a third resist layer constituting a side wall of the second opening which protrudes, over and undercut in an underlying layer, and a second resist layer constituting the underlying layer.

5. A method for making a semiconductor device according to claim 4, wherein the formation process of the resist pattern further comprises the steps of:

forming the first resist layer, the second resist layer, and the third resist layer in that order;

forming the second opening of a pattern corresponding to the over-gate section in the third resist layer;

side etching the second resist layer using the opening second formed in the third resist layer as a mask; and forming the first opening of a pattern corresponding to the fine gate section in the first resist layer.

6. A method for making a semiconductor device according to claim 5, wherein the formation process of the resist pattern further comprises an exposure step for forming the first opening in the first resist layer after said step of side etching the second resist layer.

7. A method for making a semiconductor device according to claim 5, wherein the formation process of the resist pattern further comprises an exposure step for forming the first opening in the first resist layer before said step of side etching the second resist layer.

8. A method for making a semiconductor device according to claim 6, wherein the formation process of the resist pattern further comprises an exposure step for forming an opening in the second resist layer, and both said exposure step for forming the first opening in the first resist layer and said exposure step for forming the second opening in the second resist layer are performed by electron beam exposure.

* * * * *